United States Patent
Aigner et al.

(10) Patent No.: US 6,841,922 B2
(45) Date of Patent: Jan. 11, 2005

(54) PIEZOELECTRIC RESONATOR APPARATUS WITH ACOUSTIC REFLECTOR

(75) Inventors: Robert Aigner, Unterhaching (DE); Lueder Elbrecht, Munich (DE); Stephan Marksteiner, Putzbrunn (DE); Hans-Joerg Timme, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/750,225

(22) Filed: Dec. 31, 2003

(65) Prior Publication Data

US 2004/0183400 A1 Sep. 23, 2004

Related U.S. Application Data

(63) Continuation of application No. PCT/EP02/06144, filed on Jun. 4, 2002.

(51) Int. Cl.$^7$ ............................ H03H 9/15; H01L 41/08
(52) U.S. Cl. ....................................................... 310/335
(58) Field of Search .................................. 310/320, 326, 310/327, 335

(56) References Cited

U.S. PATENT DOCUMENTS

| | | | |
|---|---|---|---|
| 5,629,906 A | * 5/1997 | Sudol et al. | 367/162 |
| 5,646,583 A | * 7/1997 | Seabury et al. | 333/187 |
| 6,603,241 B1 | * 8/2003 | Wong et al. | 310/335 |
| 6,747,529 B2 | * 6/2004 | Abe et al. | 333/188 |

* cited by examiner

Primary Examiner—Thomas M. Dougherty
(74) Attorney, Agent, or Firm—Maginot, Moore & Beck

(57) ABSTRACT

A resonator apparatus has a piezoelectric resonator as well as an acoustic reflector which has a layer having a high acoustic impedance and a layer having a low acoustic impedance. The thickness of one layer is set different from a quarter of the wavelength in this layer at the operating frequency due to technological limitations in the manufacturing of this layer, and the thickness of the other layer is set dependent from the one layer, such that a predetermined minimum quality of the acoustic reflector is attained.

9 Claims, 3 Drawing Sheets

PIEZOELECTRIC RESONATOR APPARATUS WITH ACOUSTIC REFLECTOR

CROSS-REFERENCE TO RELATED APPLICATION

This application is a continuation of copending International Application No. PCT/EP02/06144, filed Jun. 4, 2002, which designated the United States and was not published in English.

BACKGROUND OF THE INVENTION

1. Field of the Invention

The present invention relates to a resonator apparatus, in particular to a resonator apparatus having a piezoelectric resonator and an associated acoustic reflector.

2. Description of the Related Art

In FIG. 1 a resonator apparatus comprising a piezoelectric resonator 10 is shown by way of example. The piezoelectric resonator 10 comprises a piezoelectric layer 12 as well as a first electrode 14 and a second electrode 16. An acoustic Bragg reflector 18 comprising a plurality of layers $18_1$ to $18_7$ is arranged adjacent to the piezoelectric resonator 10. Further, a substrate 20 is provided. The reflector 18 is arranged between the substrate 20 and the piezoelectric resonator 10. The layers $18_1$, $18_3$, $18_5$ and $18_7$ of the acoustic reflector are layers having a low acoustic impedance, and the layers $18_2$, $18_4$, and $18_6$ are layers having a high acoustic impedance.

In piezoelectric thin film resonators (TFBAR=thin film bulk acoustic wave resonator, or FBAR=film bulk acoustic wave resonator, BAW=bulk acoustic wave) the sound wave that has been excited in the piezoelectric layer (piezo layer—see reference numeral 12 in FIG. 1) has to be insulated acoustically from the substrate 20—over which the device is constructed—to guarantee functionality.

In the prior art two methods are known for the insulation. The first method is to remove the substrate 20 or an appropriate sacrificial layer, respectively, beneath the device. In this case the resonator forms a thin self-supporting structure (membrane or bridge). The disadvantage of this procedure is that the resulting structure is very sensitive and difficult to process further, in particular with regard to the packaging of such a structure.

The second method of acoustically insulating the device from the substrate 20 is shown in FIG. 1, in which the device is constructed on the acoustic Bragg reflector 18. As has been mentioned, the latter comprises a sequence of layers $18_1$ to $18_7$ having alternating high and low acoustic impedances. With regard to the structure shown in FIG. 1, reference is made to the U.S. Pat. No. 4,166,967 as well as to the article by K. Lakin in Appl. Phys. Lett. 38, 1981, pp. 125–127. Further, reference is made to the article by G. D. Mansfeld and S. G. Alekseev, in Ultrasonics Symp. Proc., Vol. 2, 1997, pp. 891–894.

In piezoelectric resonator apparatuses as have been described with the help of FIG. 1, for example, the optimum layer thickness of the individual layers for a given operating frequency $f_0$ is around a quarter of the acoustic wavelength $\lambda_{ac}$ in the material or in the layer, respectively, and in accordance with the following condition (1) the optimum layer thickness results to be:

$$d_{opt} = \frac{\lambda_{ac}}{4} = \frac{v_{ac}}{4 \cdot f_0} = \frac{Z_{ac}}{\rho \cdot 4 \cdot f_0} \quad (1)$$

with:

$v_{ac}$=speed of sound in the layer being looked at,
$Z_{ac}$=acoustic impedance of the layer being looked at, and
$\rho$=the density of the material of the layer being looked at.

The advantage of using the acoustic Bragg reflector is that the resonators manufactured by using this reflector have a high mechanical stability. The present invention also relates to this type of acoustic decoupling.

Typical materials with high acoustic impedance are metals such as tungsten (W), platinum (Pt), molybdenum (Mo) or gold (Au). Materials with low acoustic impedance are, for example, silicon dioxide ($SiO_2$) or aluminum (Al).

When realizing the Bragg reflectors 18 shown in FIG. 1 the problems stated below may arise in several aspects.

First, the realization of the above-mentioned layer thicknesses $d_{opt}$ may be problematic for technological reasons. One example for this is the limitation of the realizable layer thicknesses due to layer stresses that are produced during deposition or creation, respectively, of these layers, so that layer thickness must not exceed a maximum thickness. This problem occurs in metals such as tungsten, platinum or molybdenum. For a 900 MHz thin film resonator (operating frequency=900 MHz) the optimum thickness for tungsten is around $d_W$=1.4 μm, for platinum around $d_{Pt}$=0.85 μm and for molybdenum around $d_{Mo}$=1.6 μm. Metal layers with such thicknesses can be realized technologically only with difficulty.

Another problem is the parasitic capacitances in the device towards the substrate. For this reason, a maximization of layer thickness is desirable for dielectric layers in the Bragg reflector, such as silicon dioxide, for electrical reasons (minimization of the parasitic capacitances towards the substrate). However, dielectric layers with corresponding thicknesses contradict the above condition (1), as in this case layer thickness exceeds the optimum layer thickness.

Another problem is the different temperature coefficients of the layers $18_1$ to $18_7$. The temperature coefficients of the layers used have an influence on the temperature behavior of the thin film resonator. In the case that the materials for the layers having a high acoustic impedance and for the layers having a low acoustic impedance have temperature coefficients different in sign, a layer thickness combination with minimal temperature coefficients of the thin film resonators can generally be found, however the layers then have thicknesses which do not correspond to the optimum layer thickness, so that such a layer thickness combination generally contradicts the above condition (1).

In the prior art realizations of thin film resonators, as are shown in FIG. 1, are known, in which the acoustic reflector is constructed by means of layers complying with the above condition 1 with regard to layer thickness. However, this results in an undesirable limitation of the choice of the useable materials and the attainable frequency ranges. If, for example, aluminum nitride (AlN) is used as material with high acoustic impedance and $SiO_2$ as material with low acoustic impedance, as is described by R. S. Naik, et al. in IEEE Trans. Ultrasonics, Ferroelectrics, and Freq. Control, 47(1), 2000, pp. 292–296, the above-mentioned problem associated with the parasitic capacitances can be avoided. As the two materials mentioned are dielectrics, this problem does not occur. However, with this material combination the difference between the acoustic impedances is comparatively small, which adversely affects the quality of the Bragg reflector, and is considerably lower with the same number of layers than in Bragg reflectors using one of the above-mentioned metal layers as material with high acoustic impedance.

SUMMARY OF THE INVENTION

It is the object of the present invention to provide an improved resonator apparatus in which the above-stated problems associated with the manufacturing of thick layers, associated with parasitic capacitances and with different temperature coefficients can be minimized or avoided.

In accordance with a first aspect, the present invention provides a resonator apparatus having a piezoelectric resonator and an acoustic reflector having a sequence of stacked layers having alternating low and high acoustic impedance, wherein the thickness of one layer is set different from a quarter of the acoustic wavelength in this layer at the operating frequency due to technological limitations during manufacturing of this layer, and wherein the thickness of the other layer is set dependent from the one layer, such that a predetermined minimum quality of the acoustic reflector is attained.

The present invention is based on the finding that even Bragg reflectors not complying with the above condition with regard to the optimum layer thickness and nevertheless having a high reflectivity can be realized. If the layer thickness d unequal $d_{opt}$ is chosen for a layer material, a layer thickness in which the reflectivity of the Bragg reflector, i.e. its quality, becomes maximal, can be found for the other layer material.

According to a preferred embodiment of the present invention, Bragg reflectors consisting of metal layers with a thickness of d<$d_{opt}$ and of $SiO_2$-layers with a thickness of d>$d_{opt}$ can thereby be manufactured in particular. At the same time the problems occurring in the manufacturing of layers and due to the parasitic capacitances can thereby be reduced or eliminated. Further, it is possible to realize the reflectors such that minimal temperature coefficients of the total resonator are attained, and in particular resonators can be realized in which this criterion is fulfilled better than in resonators which use layers having a thickness corresponding to the optimum layer thickness.

Compared to the methods known in the prior art the present invention thus teaches the deliberate violation of the condition with regard to the optimum layer thickness, so that with simultaneous adaptation of the layer thickness of one material, with given layer thickness of the other material, the reflectivity of the Bragg reflector becomes maximal. The advantage of the inventive procedure is that the layer stacks of the reflector thus obtained have ease of technological realization and thus have further advantages associated with process stability and process costs. Another advantage is that particular electric properties, such as the reduction of parasitic capacitances, as well as a stable temperature behavior of the thin film resonator can be attained at the same time by corresponding layer thickness adaptations.

According to a preferred embodiment the thickness of one layer is decreased relative to the optimum value, and the thickness of the other layer is increased relative to the optimum value. In this respect it is to be understood that according to another embodiment one layer is either the layer having a low or a high acoustic impedance, the other layer then being the layer having a high or low impedance, respectively.

Preferably, the layers having a high acoustic impedance consist of the same material, and the layers having a low acoustic impedance also consist of the same material, so that in this case the Bragg reflectors are made of two different materials. However, the present invention is not limited to this design, instead more than two materials can also be used in a Bragg reflector, so that, for example, the layers having a high acoustic impedance and/or the layers having a low acoustic impedance are made of different materials.

BRIEF DESCRIPTION OF THE DRAWINGS

Preferred embodiments of the present invention will be explained in greater detail below with the help of the accompanying drawings, in which.

DESCRIPTION OF THE PREFERRED EMBODIMENT

Figure 1:
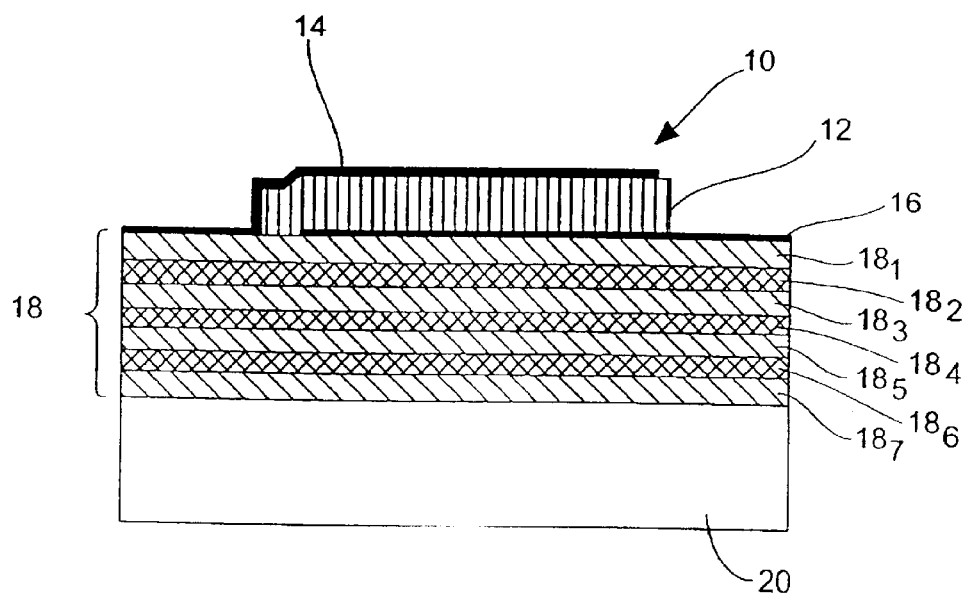
FIG. 1 is a prior art resonator apparatus with an acoustic reflector with layers having an optimum thickness.

With the help of FIG. 2 a preferred embodiment of the present invention is explained in greater detail below. The representation of the resonator apparatus in FIG. 2 is similar to th at in FIG. 1, but according to the embodiment the reflector 18 comprises only five layers $18_1$ to $18_5$, which furthermore depart from the embodiment illustrated in FIG. 1 in that their thicknesses depart from the optimum thicknesses of the layers as they are determined for these optimum layer thicknesses according to the above stated condition (1).

Figure 2:
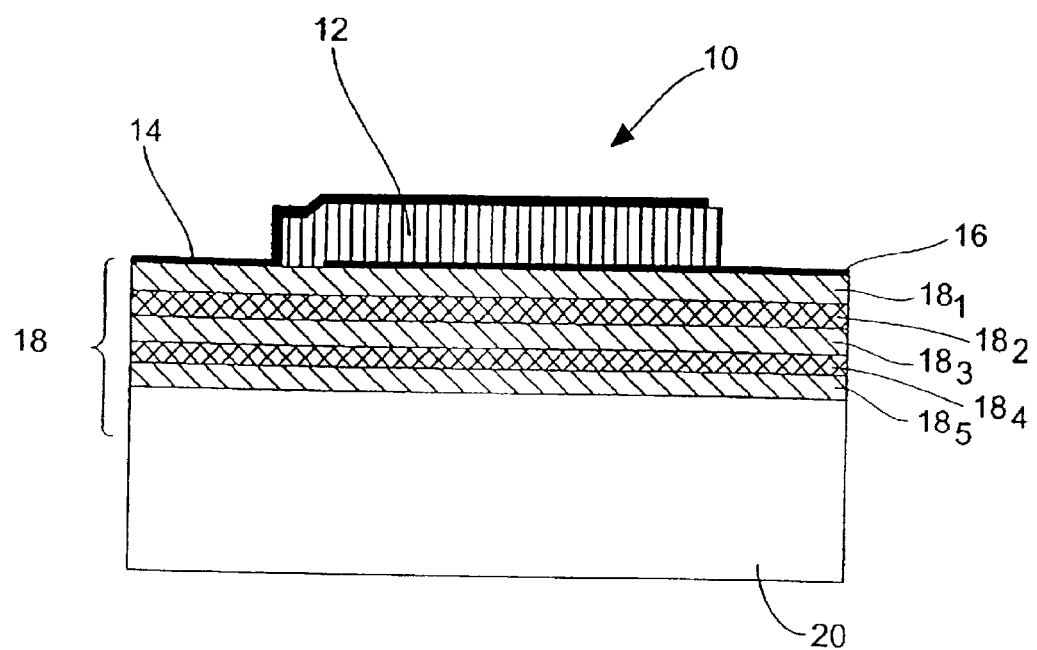
FIG. 2 is a resonator apparatus according to an embodiment of the present invention.

In FIG. 2 an embodiment is shown in which the Bragg reflector 18 comprises a succession of layers consisting of a $SiO_2$-layer $18_1$, a Mo-layer $18_2$, a $SiO_2$-layer $18_3$, a Mo-layer $18_4$ and a $SiO_2$-layer $18_5$. The resonance frequency of the resonator apparatus is 900 MHz. For the further consideration it is assumed that, without limiting the general character, silicon is the substrate material and 12 ZnO is the piezoelectric material.

If the above condition with regard to the optimum layer thickness was used as a basis, an optimum layer thickness of the $SiO_2$-layers would result for the Bragg reflector 18 which is approximately equal to the optimum density of the Mo-layers and would amount to approximately 1600 nm ($d_{opt}^{SiO2} \cong d_{opt}^{Mo} \cong 1600$ nm). With the help of a Mason model, which is described, for example, by K. M. Lakin, G. R. Kline, and K. T. McCarron, IEEE Trans. Microwave Theory Techniques, Vol. 41, No. 12, 1993 or by V. M. Ristic, "Principles of acoustic devices", Wiley (1983), the electric behavior was calculated for various oxide or molybdenum thicknesses, respectively, in the reflector. In doing so, no material attenuation was used, and the underside of the substrate was modeled to be perfectly absorbing. Thus an energy loss into the substrate can only occur through the Bragg reflector. The resonator quality can therefore be used as a direct measure of the quality of the Bragg reflector. The quality of the resonator, in turn, can be calculated very easily from the characteristic curve of impedance using the slope of the phase curve (see K. M. Lakin, G. R. Kline, and K. T. McCarron, IEEE Trans. Microwave Theory Techniques, Vol. 41, No. 12, 1993).

Figure 3:
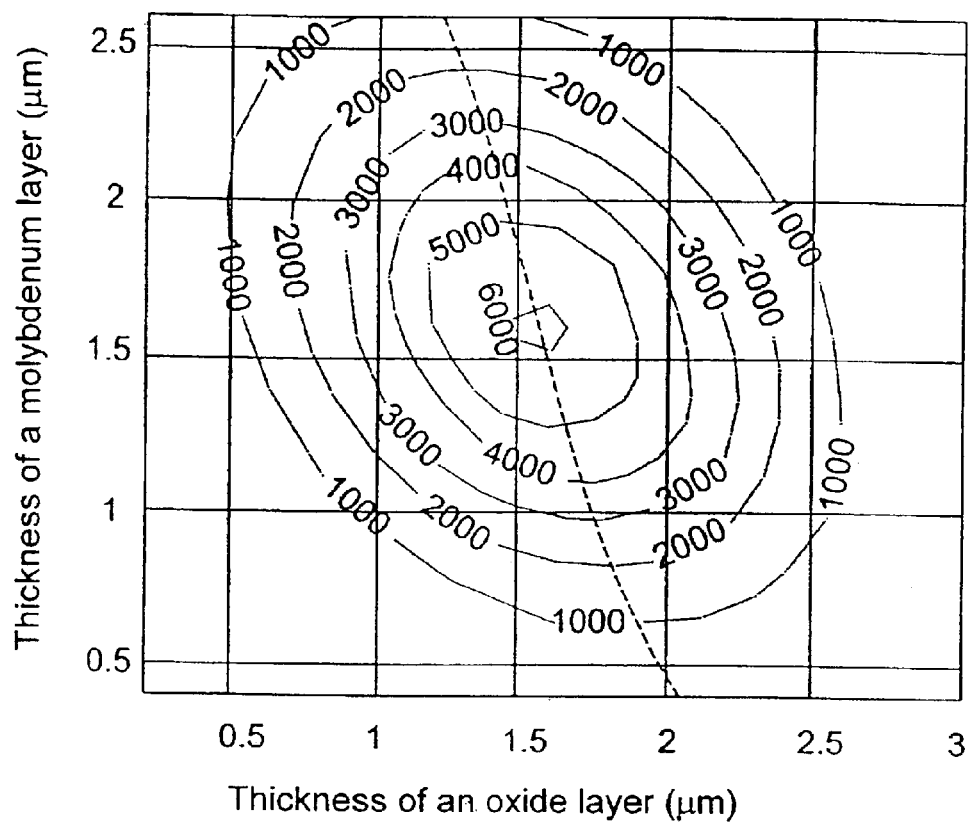
FIG. 3 is a representation of the isocontur lines of the quality of the resonator shown in FIG. 2 as a function of the thickness of the layer having a high acoustic impedance and of the thickness of the layer having a low acoustic impedance.

In FIG. 3 the isocontur line of the quality of a BAW resonator on a Bragg reflector is illustrated, the Bragg reflector consisting of two layers of molybdenum and three layers of $SiO_2$. The quality is represented as a function of the oxide or molybdenum thickness, respectively. The broken line shown in FIG. 2 represents the optimum layer thickness combination, when the thickness of a layer, e.g. the thickness of the molybdenum, has been predetermined.

As can be seen in FIG. 2, the maximum quality of approximately 6200 is obtained for the above-mentioned $\lambda/4$ layer thicknesses of 1600 nm. A quality of 1000 to 2000 is usually sufficient for common filter applications in the field of telecommunication. Further, in reality higher qualities cannot be implemented as a rule, as the quality of the overall arrangement is then dominated by other loss channels, such as electric loss in the resonator, acoustic losses by non-vertical oscillation modes as well as electric losses by electric parasities.

As a look at the isocontur line at Q=2000 in FIG. 2 will show, this quality can already be attained with a molybdenum thickness of 800 nm and an oxide thickness of 1800 nm. Therefore only half as much molybdenum is required, which makes technological realizability significantly easier. At the same time the $SiO_2$ layer thickness is increased by more than 10% compared to the $\lambda/4$ layer thickness, which is associated with a reduction of the parasitic capacitance towards the substrate. Another possibility to implement the present invention is, with a given reflector quality, to optimize not only the thickness of the layers with respect to process constraints but also to determine the number of mirror layers yourself. A calculation analogous to the one described above, but with three Mo-layers, yields e.g. that a reflector quality of 5000 can be attained with three Mo-layers each having a thickness of 550 nm. In the case of two layers (see FIG. 3) the layer thickness of each of the molybdenum layers would be approximately 1300 nm to attain the same quality. Thus, in the first case, only molybdenum with a thickness of 1600 nm has to be deposited, whereas in the second case a deposition with a thickness of 2600 nm is necessary to realize a reflector with the same quality.

Preferably, it is tried according to the present invention to reduce the thickness of the metal layers, which represent the layers having a high acoustic impedance, whereas dielectric layers have an increased thickness, so as to reduce the problems associated with the technical realization of the metal layers and, at the same time, the problems associated with parasitic capacitances.

While this invention has been described in terms of a preferred embodiment, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

List of Reference Numerals 10 resonator
12 piezoelectric layer
14 first electrode
16 second electrode
18 Bragg reflector
$18_1$ layer having a low acoustic impedance
$18_2$ layer having a high acoustic impedance
$18_3$ layer having a low acoustic impedance
$18_4$ layer having a high acoustic impedance
$18_5$ layer having a low acoustic impedance
$18_6$ layer having a high acoustic impedance
$18_7$ layer having a low acoustic impedance
20 substrate

What is claimed is:

1. A resonator apparatus comprising
    a piezoelectric resonator; and
    an acoustic reflector comprising a sequence of stacked layers having alternating low and high acoustic impedance;
    wherein the thickness of one layer is set different from a quarter of the acoustic wavelength in this layer at the operating frequency due to technological limitations in the manufacturing of this layer, and
    wherein the thickness of the other layer is set dependent from the one layer, such that a predetermined minimum quality of the acoustic reflector is attained,
    wherein the thickness of the one layer is decreased relative to the quarter of the wavelength, and wherein the thickness of the other layer is increased relative to the quarter of the wavelength.

2. The resonator apparatus according to claim 1, wherein the one layer is the layer having a high acoustic impedance and wherein the other layer is the layer having a low acoustic impedance.

3. The resonator apparatus according to claim 1, wherein the one layer is the layer having a low acoustic impedance, and wherein the other layer is the layer having a high acoustic impedance.

4. The resonator apparatus according to claim 1, wherein the acoustic reflector is a plurality of layers having a high acoustic impedance and comprises a plurality of layers having a low acoustic impedance.

5. The resonator apparatus according to claim 1, wherein the layer having a high acoustic impedance is made of tungsten, platinum, molybdenum or gold, and wherein the layer having a low acoustic impedance is made of silicon dioxide or aluminum.

6. The resonator apparatus according to claim 5, wherein the thickness of the layer having a high acoustic impedance is of approximately one eighth of the wavelength in this layer at the operating frequency, and wherein the thickness of the layer having a low acoustic impedance is increased by approximately 10% relative to the quarter of the wavelength.

7. The resonator device according to claim 1 comprising a substrate, wherein the acoustic reflector is arranged between the substrate and the piezoelectric resonator.

8. The resonator apparatus according to claim 7, wherein the piezoelectric resonator is made of ZnO or AlN, and wherein the substrate is made of silicon.

9. The resonator apparatus according to claim 1, wherein the piezoelectric resonator is a BAW resonator.

* * * * *

UNITED STATES PATENT AND TRADEMARK OFFICE
CERTIFICATE OF CORRECTION

PATENT NO. : 6,841,922 B2
DATED : January 11, 2005
INVENTOR(S) : Aigner et al.

It is certified that error appears in the above-identified patent and that said Letters Patent is hereby corrected as shown below:

<u>Title page</u>,
Item [30], Foreign Application Priority Data, should read:
-- [30]   Foreign Application Priority Data
July 30, 2001  (DE) .....................101 37 129.2-35 --

Signed and Sealed this

Tenth Day of May, 2005

JON W. DUDAS
*Director of the United States Patent and Trademark Office*